(12) United States Patent
Albon et al.

(10) Patent No.: US 6,249,482 B1
(45) Date of Patent: Jun. 19, 2001

(54) SYNCHRONOUS MEMORY (75) Inventors: Richard Albon, Mary Tavy; Alan Martin, Plympton; David Johnston, Tavistock, all of (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/498,092

(22) Filed: Feb. 4, 2000

(30) Foreign Application Priority Data

Feb. 6, 1999 (GB) .................................................. 9902561

(51) Int. Cl.$^7$ ........................................................ G11C 8/00

(52) U.S. Cl. ............................................ 365/233; 365/207

(58) Field of Search ...................................... 365/233, 207

(56) References Cited

U.S. PATENT DOCUMENTS 5,867,446 * 2/1999 Konishi et al. ........................ 365/233

* cited by examiner

Primary Examiner—David Nelms
Assistant Examiner—M. Tran
(74) Attorney, Agent, or Firm—Kirschstein, et al.

(57) ABSTRACT

A synchronous single port random access memory comprises a core 2 of memory cells 3 arranged as rows and columns. The rows are addressed by a row decoder 5 and the memory cell outputs are connected as columns to a column decoder and multiplexer 7. The decoder and multiplexer 7 selects groups of memory cells 3 from the addressed row and connects these to sense amplifiers 8. Changes in address are propagated immediately to the core 2 so that the selected memory cells 3 are connected as quickly as possible and without any fixed delays to the sense amplifiers 8. Similarly, a read clock "rclk" enables the sense amplifiers 8 immediately upon becoming active.

10 Claims, 6 Drawing Sheets

SYNCHRONOUS MEMORY

BACKGROUND OF THE INVENTION

1. Field of the Invention

The present invention relates to a synchronous memory, such as of the single port random access type.

2. Description of the Prior Art

Figure 1:
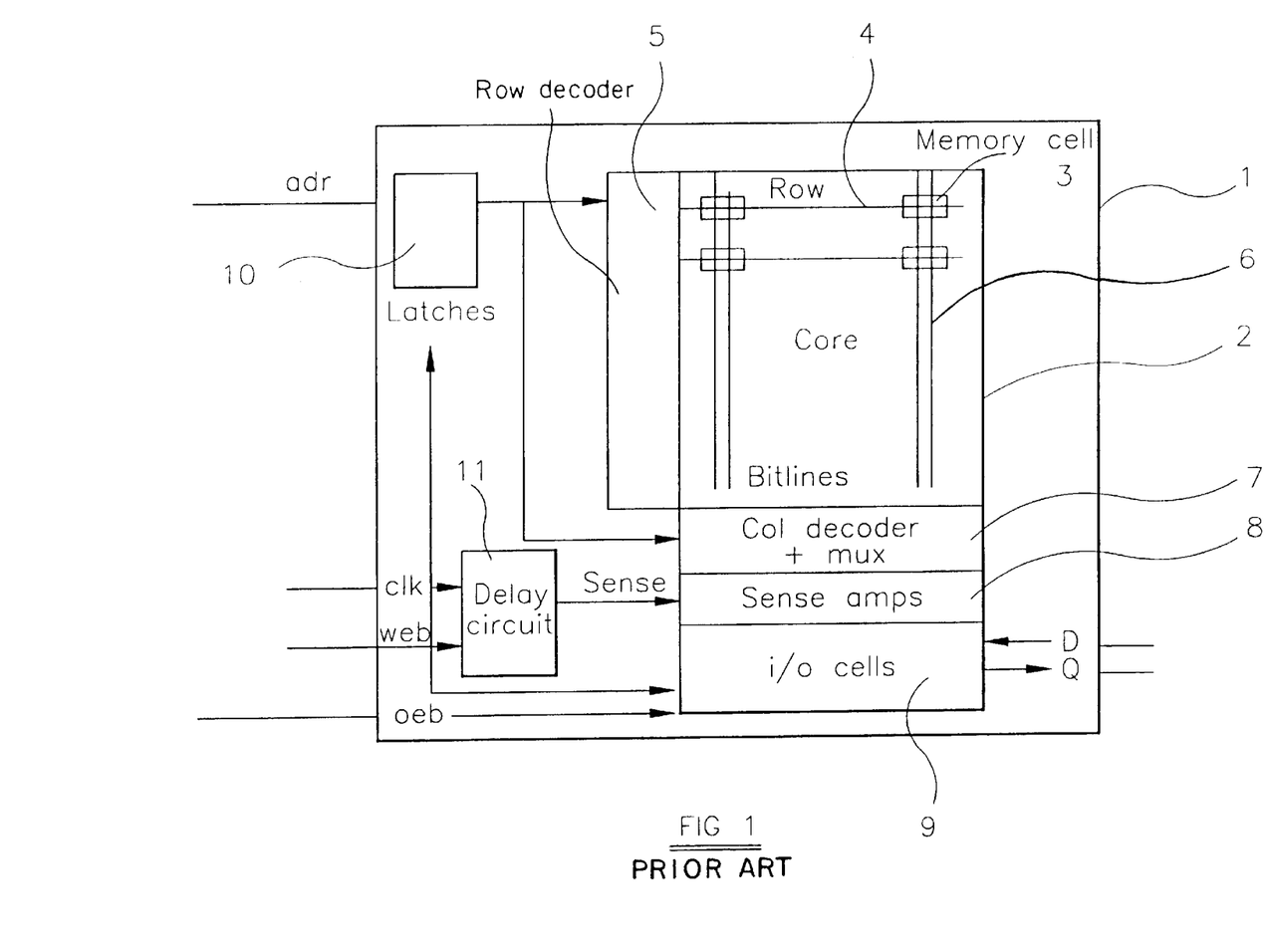
FIG. 1 is a block diagram of a known type of static RAM according to the prior art.

FIG. 1 of the accompanying drawings illustrates a known type of static random access memory (RAM), perhaps more descriptively also known as a read/write memory. The memory 1 comprises a core 2 containing an array of memory cells such as 3 arranged as rows and columns. The rows of memory cells 3 are connected via respective row address lines such as 4 to a row decoder 5. The column of memory cells 3 are connected via respective column address lines or pairs of lines such as 6 to a column decoder and multiplexer 7. The or each output of the column decoder and multiplexer 7 is connected to the input of a respective one of a set of sense amplifiers 8. The sense amplifiers 8 are connected to input/output cells 9 having inputs for receiving data signals D to be read into or stored in the memory 1 and outputs Q for data read from the memory 1.

The memory 1 has an address input "adr" in the form of a parallel bus connected to a plurality of latches 10. The memory 1 also has a clock input clk for controlling timing of the memory connected to the sense amplifiers 8 via a delay circuit 11. The memory also has inputs for a write enable signal web and an output enable signal "oeb".

Figure 2:
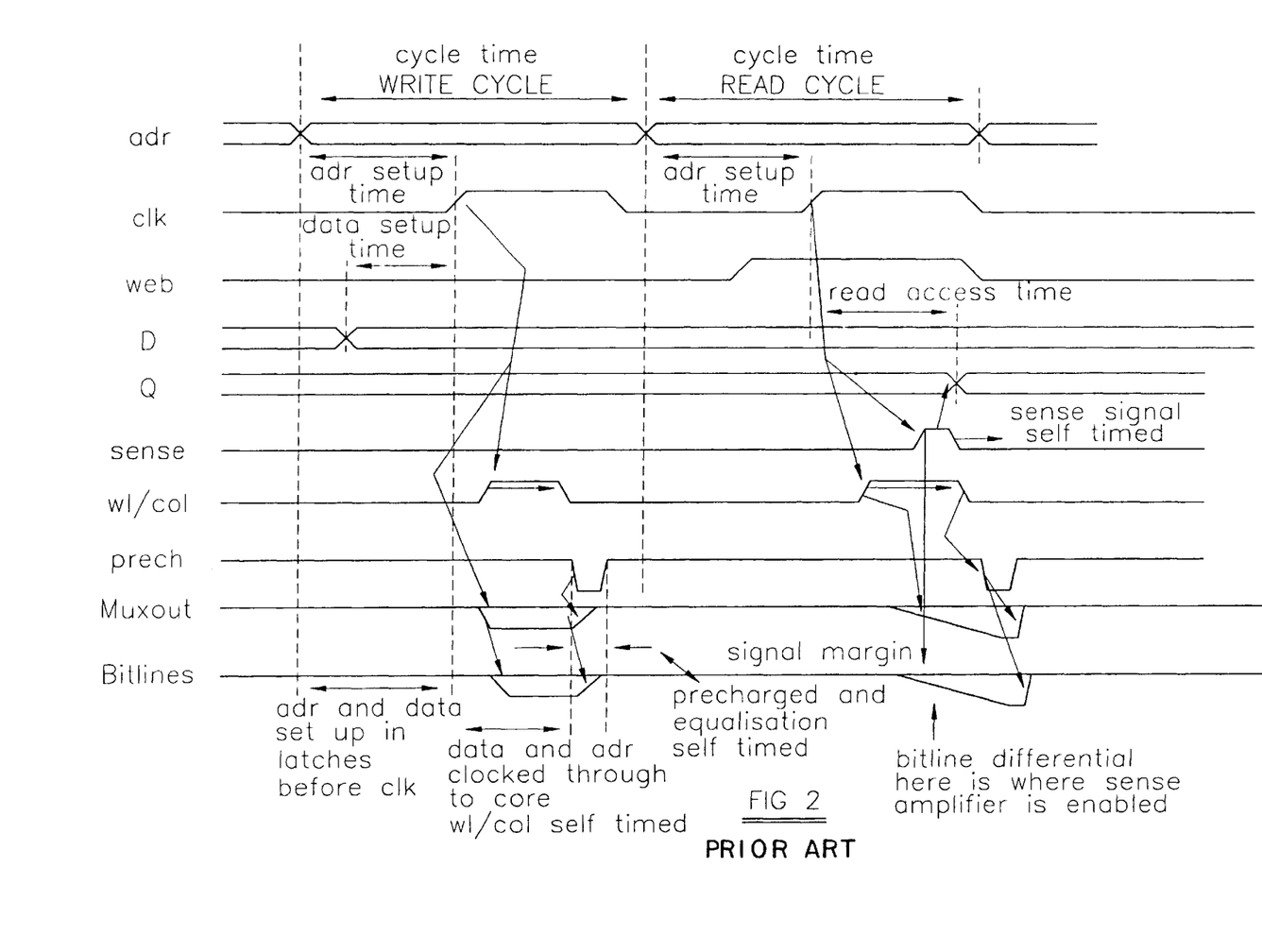
FIG. 2 is a waveform diagram illustrating waveforms occurring in the memory of FIG. 1 according to the prior art.

FIG. 2 is a detailed timing diagram illustrating operation of the memory shown in FIG. 1. In addition to the signals already identified, FIG. 2 illustrates a sense amplifier enable signal "sense", row select and column select signals "wl/col" as supplied to the row decoder 5 and the column decoder and multiplexer 7, precharge control signals "prech" for precharging the row and column address lines, multiplexer output signals "muxout" occurring within the column decoder and multiplexer 7, and signals "bitlines" supplied to the memory cells 3 during write cycles and received at the inputs of the sense amplifiers 8 during read cycles.

The left part of FIG. 2 illustrates a write cycle. This is initiated when a new address "adr" is supplied to the memory and latched in the latches 10. Before writing to the memory cells 3 can begin, it is necessary to wait for a period known as an "address setup time" so that the correct addressing signals appear in the row decoder 5 and the column decoder and multiplexer 7 at the "edge" of the core 2. However, the signals are not yet supplied to the core 2. During the address set up time, the data D to be written into the memory are supplied and a "data setup time" has to be allowed, again, for the fresh data to be ready to present to the core 2. The address and data set up times end when a clock pulse "clk" is received for activating the write operation. The arrival of the active clock pulse allows the signals to propagate on the address lines 4 and 6 into the core 2 so that the fresh data are written into the addressed or selected memory cells 3. However, there is a delay between the start of the clock pulse "clk" and the row and column select signals "wl/col" propagating into the core 2. After this delay, the multiplexer ouput "muxout" and the signals "bitlines" to the memory cells appear so that the fresh data are written into the selected memory cells 3.

After a predetermined time, the row decoder 5 and the column decoder and multiplexer 7 remove the select signals "wl/col" from the edges of the core 2. A precharge signal "prech" is then used to precharge the address lines 4 and 6 to any desired precharge, such as zero charge. The clock signal "clk" then goes low and the memory is then ready for the next cycle.

The right part of FIG. 2 illustrates a read cycle which, again, begins with a new address signal "adr" being applied to the address input of the memory 1. The active low write enable signal "web" goes high shortly after the new address has been supplied so that the memory 1 is ready for a read operation. After the address setup time, which is the same as that illustrated during the write cycle in FIG. 2, the clock signal "clk" goes high and the select signals "wl/col" are supplied to the edge of the core 2. When the stored value of one of the memory cells 3 corresponds to a different charge state of the column address lines 6, the capacitance of the lines 6 and the various other parasitic capacitances (and inductances) through the read path via the multiplexers to the differential inputs of the sense amplifiers have to be charged to a level such that the differential voltage input at the inputs of the sense amplifiers 8 is sufficient for the outputs of the sense amplifiers 8 to produce the correct signal level corresponding to the stored data. The necessary signal margin is indicated in the bottom waveform of FIG. 2, at which time the sense amplifiers 8 are enabled by the signal "sense".

The read cycle ends when the clock signal "clk" goes low and another precharge operation is carried out prior to the next memory cycle.

During a read cycle, the leading edge of the clock signal "clk" must follow a change in the address "adr" by a sufficiently long address setup time for the row decoder 5 and the column decoder and multiplexer 7 to be ready to access the core 2 correctly. Thus, the row decoder 5 must be ready to supply a row select signal "wl" and the column decoder and multiplexer 7 must be set up ready to access the correct column before the clock signal "clk" can become active. The read access time shown in FIG. 2 corresponds to the active phase of the clock signal "clk". Once the clock signal "clk" has gone high to become active, time must be allowed for the select signals "wl/col" to propagate into the core and for the sense amplifier input to achieve the necessary signal margin for the worst possible combination of elements causing delays. The sense signal "sense" therefore becomes active after a predetermined or self-timed delay following the rising edge of the clock signal clk. Also, the duration of the enable signal "sense" is self-timed.

Figure 3:
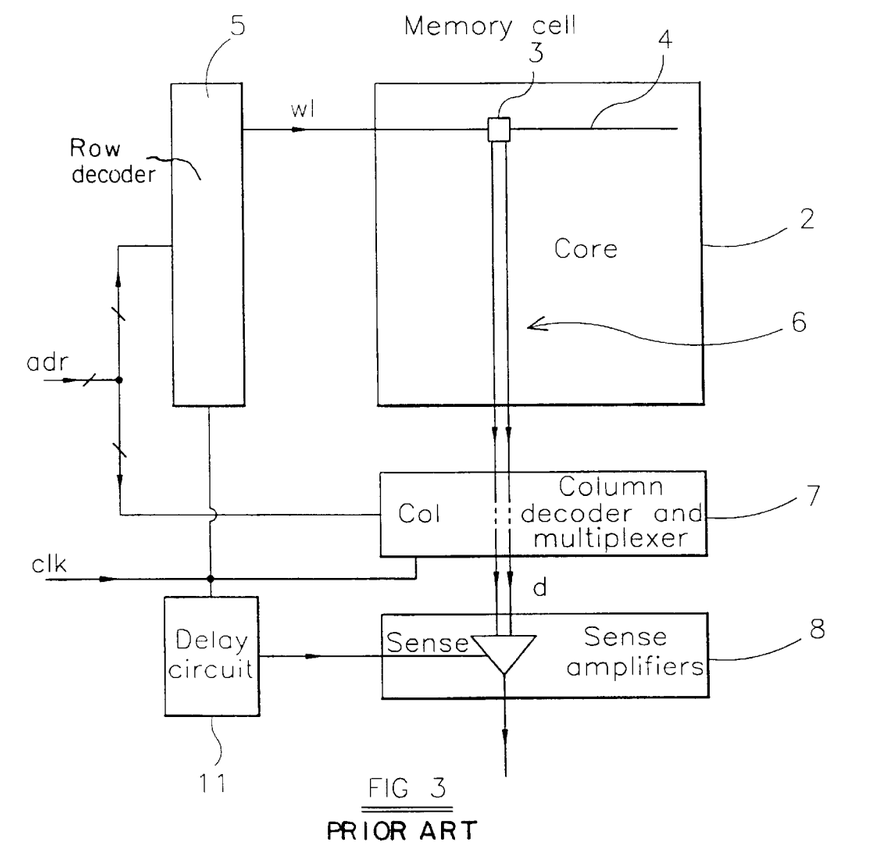
FIG. 3 is a schematic block diagram illustrating part of the memory of FIG. 1 according to the prior art.
Figure 4:
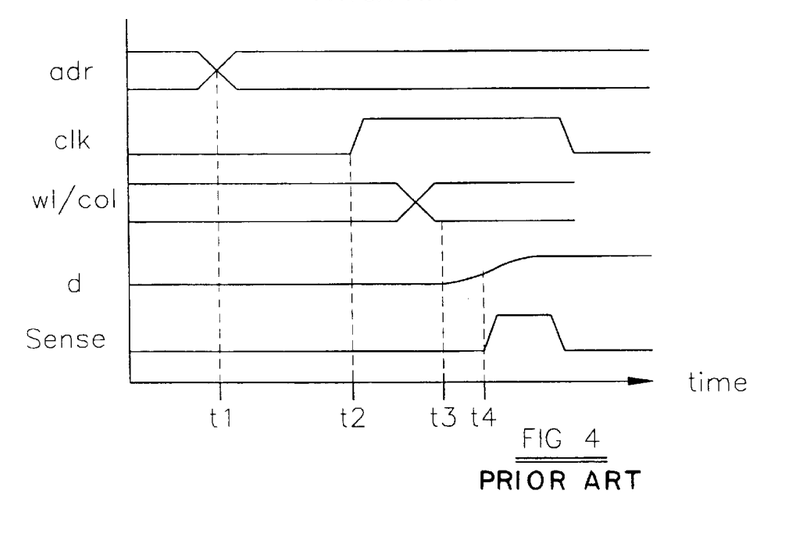
FIG. 4 is a waveform diagram illustrating some of the waveforms which occur in the part of the memory shown in FIG. 3 according to the prior art.

FIG. 3 illustrates part of the memory 1 in a more detailed schematic manner so as to illustrate the processes during a read cycle including those which are self-timed. At a time t1, the address "adr" changes. Following the address setup time to allow the circuits within the row decoder 5 and the column decoder and multiplexer 7 to stabilize, the clock signal "clk" rises at time t2. The clock signal "clk" directly clocks the row decoder 5 and the column decoder and multiplexer 7 so that the row select signal "wl" is supplied to the selected row address electrode 4 and the column select signal "col" connects the column address lines 6 of the selected memory cell or cells 3 (only one illustrated in FIG. 3) through the multiplexing to the inputs of the corresponding sense amplifier. This phase of operation is complete at time t3, after which the charge stored in the memory cell 3 representing the stored bit of data can begin to charge the column address lines 6 and any parasitic capacitances within the column decoder and multiplexer 7. Similarly, the output signals from the column decoder and multiplexer 7 begin charging the differential inputs of the sense amplifier 8. The differential signal d at the input of the sense amplifier 8 is illustrated in FIG. 4 for a "worst case" condition where the various circuit elements require the longest time to be charged to the minimum signal margin for causing the sense amplifier 8 to switch its output to the correct value. This margin is achieved at a time t4 when the delay circuit 11 supplies the sense amplifier enable signal "sense" to the sense amplifiers 8.

In order for a read cycle to operate correctly, the time period from t1 to t2 must be sufficient for the row decoder 5 and column decoder and multiplexer 7 to settle correctly after a change of address "adr". The clock pulses "clk" must therefore be delayed with respect to changes of address signals adr by a sufficient time period to ensure that sufficient address setup time is available for all conditions. These relative timings are controlled by devices external to the memory.

The time period between the time t2 and the time t4 is self-timed within the memory and must be sufficient to ensure that, in the worse case conditions, the stored data are correctly read from the memory.

When designing a RAM compiler for embedded applications, the self-timing performed during the read cycle has to allow for the worst case conditions of operation and the technology, the extremes of loading on delay circuits for the self timing of any size of RAM, and likely variations in technologies between different foundries. It is desirable to minimize the self-timed periods within the memory 1 so as to minimize the read cycle time and hence maximize the speed of operation of the memory. However, the self-timed periods must be sufficiently long, as mentioned above, to cater for all circumstances. It is generally the case that the design of a RAM compiler has to be performed before sufficient information is available to judge precisely by how much the self-timed periods can be reduced in order to provide the best performance. Although programmable delays in self timing permits some flexibility after completion of design, such programming is done in incremental steps and does not therefore allow the best signal margin/performance compromise to be achieved.

U.K. Patent No. 2 208 479 discloses an asynchronous dynamic RAM (DRAM) which has a common input/output port for receiving signals in time-multiplexed or packet format. In particular, the port receives, in sequence, packets representing read/write signal, row address signals, column address signals and a data sequence. During a write cycle, the data sequence is supplied to the DRAM whereas, during a read cycle, the data sequence is read from the DRAM and made available at the port. Internal decoding ensures that the DRAM is set to the appropriate mode and that the row and column address signals are supplied to the appropriate decoders.

The read cycle is controlled by an internal high speed oscillator which is active only during a part of the read cycle when the stored data are available at the port. This is said to ensure that the data become available as soon as possible for accessing by an external device connected to the port. A reference signal is simultaneously generated so as to indicate that the data are available. Thus, a read cycle is effectively controlled by the internal clock and does not make use of an external clock when the data are to be made available (in packet form) at the port.

U.K. Patent No. 2 286 271 discloses a cache memory using a RAM including sense amplifiers which are energized after the start of an internal address decoding operation. The sense amplifiers are enabled as soon as a row enable signal of the memory core is enabled i.e. without any possibility of delay. This technique is said to reduce power consumption but forces the sense amplifiers to be active before the bit lines have had a chance to follow the stored data. Thus, the outputs of the sense amplifiers are not initially valid and further blocking/gating is necessary to prevent invalid outputs being produced. This document does not disclose any details of timing of precharging of the bit lines.

International Publication No. WO 97/08705 discloses a DRAM in which a system clock of a system in which the DRAM is provided controls a DRAM read cycle, either directly or by means of a phase-locked loop provided within the structure of the DRAM. In particular, the clock signal edges are used to control the timing of row address reading, precharge ending and sense amplifier enabling. Row address decoding does not begin until an access control signal has been asserted and a first clock transition or edge is received. This may result in delays in address decoding. The next clock signal transition or edge then causes the sense amplifiers to be enabled. Accordingly, the sense amplifiers cannot be enabled independently of the addressing operation. The timing of these events is therefore set by the parameters of the phase-locked loop, which are established during design and manufacture of the DRAM, or by the clock pulse widths of the system in which the DRAM is installed.

A similar arrangement is disclosed in U.S. Pat. No. 5,708,624. However, this patent specification also discloses an asynchronous mode of operation for testing purposes at relatively low clock frequencies. In this arrangement, the internal timing of the DRAM such as address decoding and sense amplifier enabling are controlled by fixed predetermined delays.

SUMMARY OF THE INVENTION

According to the invention, there is provided a synchronous memory comprising: a plurality of memory cells; N sense amplifiers having inputs, where N is a positive integer; an address input; an addressing circuit arranged to select N offset memory cells in response to an address at said address input and to connect said selected N memory cells to said inputs of said N sense amplifiers respectively; and a first clock input arranged to enable said N sense amplifiers immediately upon receipt of an active read clock signal.

The memory may comprise a single port random access memory.

The memory may comprise a static random access memory.

The memory may comprise a second clock input for receiving write clock signals for controlling writing into said memory.

The memory may comprise a first decoder for decoding said address to enable reading of a selected group of said memory cells, and a second decoder and multiplexer for decoding said address to connect N of said memory cells of said selected group to said inputs of said N sense amplifiers respectively. The memory may comprise a timer for disabling said sense amplifiers a predetermined time after receipt of said active read clock signal.

The memory may comprise row address lines, column address lines and a precharging arrangement, said memory cells being arranged at least notionally as rows connected to said row address lines and columns connected to said column address lines, said row and column address lines being connected to said precharging arrangement for precharging said row and column address lines after a change of said address at said address input. Said precharging arrangement may be arranged to precharge only said column address lines after a change in only a column address.

It is thus possible to eliminate certain self-timing or predetermined time periods from the memory in order to allow optimum performance to be achieved. In particular, by allowing the memory cells to be accessed without any predetermined delays, signals from the memory cells drive the sense amplifier inputs with the minimum possible delay. The timing of read clock signals may therefore be adjusted so as to minimize read cycle times and thus maximise the performance of the memory. In particular, the delay between an address change and an active read clock signal can be set to any desired value and need not be limited by any fixed duration time periods as in known types of memories.

BRIEF DESCRIPTION OF THE DRAWINGS

The invention will be further described by way of example, with reference to the accompanying drawings, in which.

DETAILED DESCRIPTION OF THE PREFERRED EMBODIMENTS

Like reference numerals referred to like parts throughout the drawings.

Figure 5:
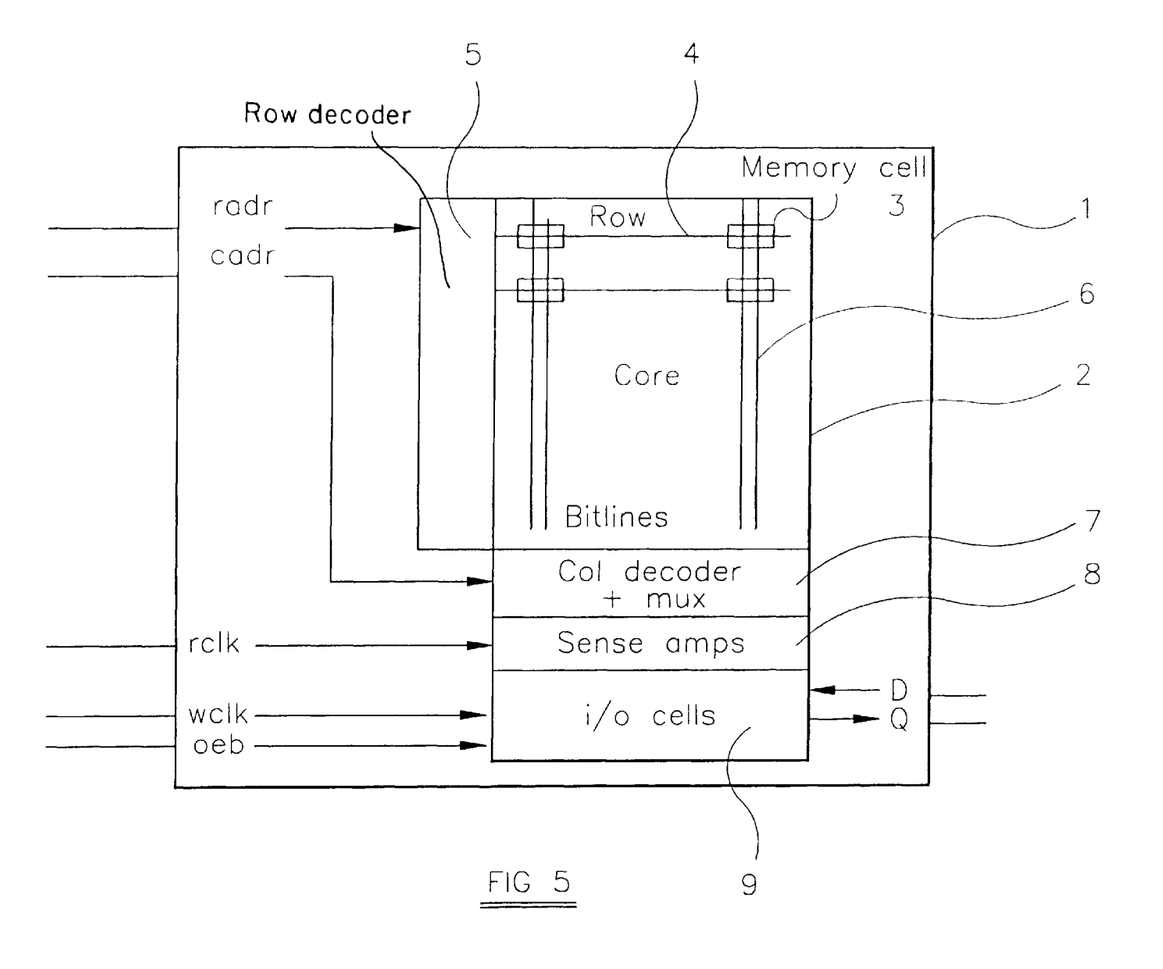
FIG. 5 is a block diagram illustrating a static synchronous single port RAM constituting an embodiment of the invention.

The memory shown in FIG. 5 is of a similar type to that shown in FIG. 1 and the corresponding elements will not therefore be described again in detail. However, the memory shown in FIG. 5 differs in several important respects from that shown in FIG. 1. Thus, the memory 1 in FIG. 5 is addressed by separate row address signals "radr" and column address signals "cadr", which are supplied directly to the row decoder 5 and the column decoder and multiplexer 7, respectively. The memory 1 of FIG. 5 does not have a single clock signal input "clk" and a write enable input "web" but instead has separate read and write clock inputs "rclk" and "wclk", respectively. Also, separate row precharge and column precharge control signal "rowprech" and "colprech", respectively, are provided.

Figure 6:
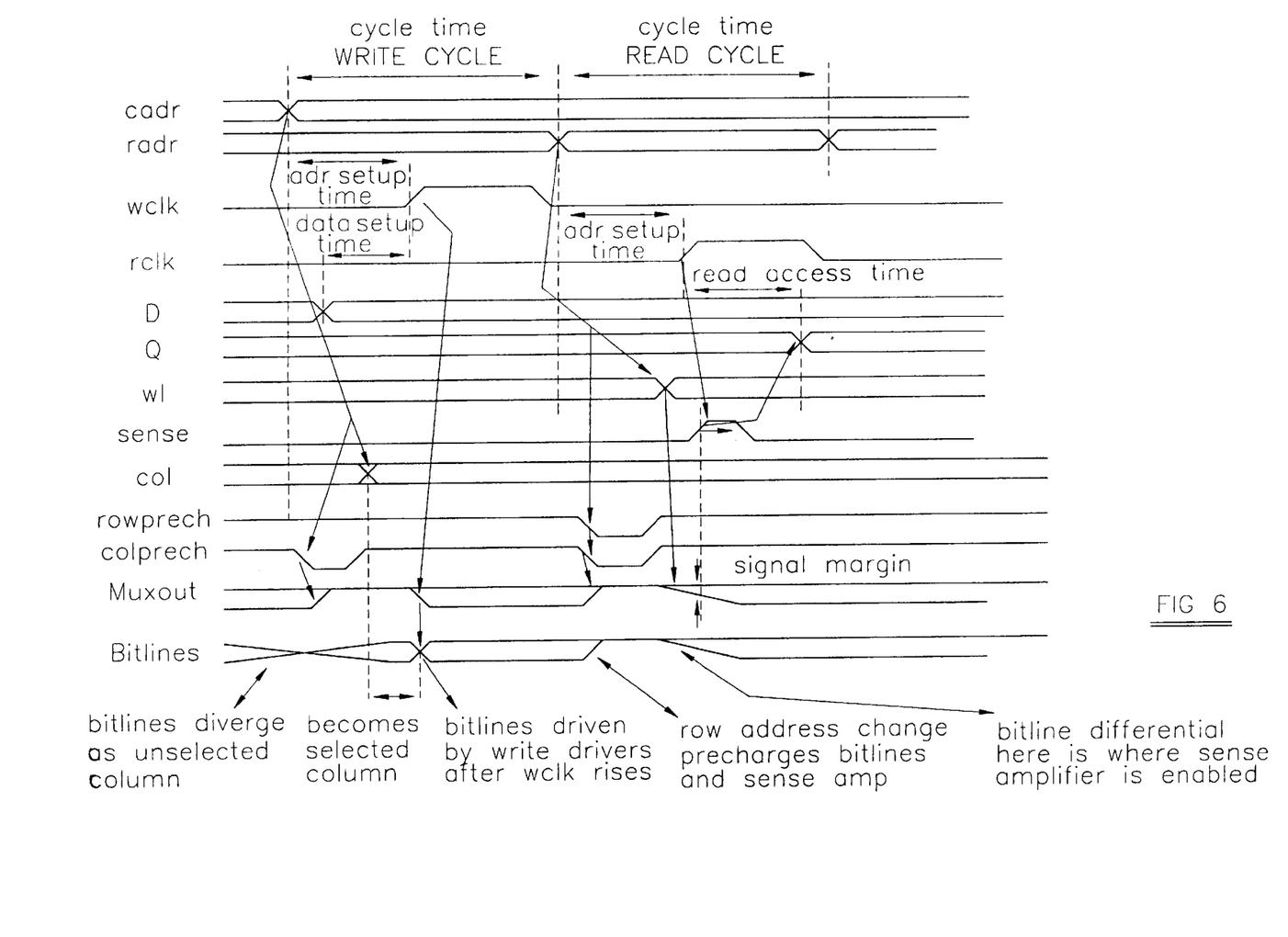
FIG. 6 is a waveform diagram illustrating waveforms occurring in the memory of FIG. 5.

Operation of the memory 1 of FIG. 5 is illustrated in FIG. 6. The write cycle is essentially the same as the write cycle illustrated in FIG. 2 for the memory of FIG. 1 and will not therefore be further described.

Figure 7:
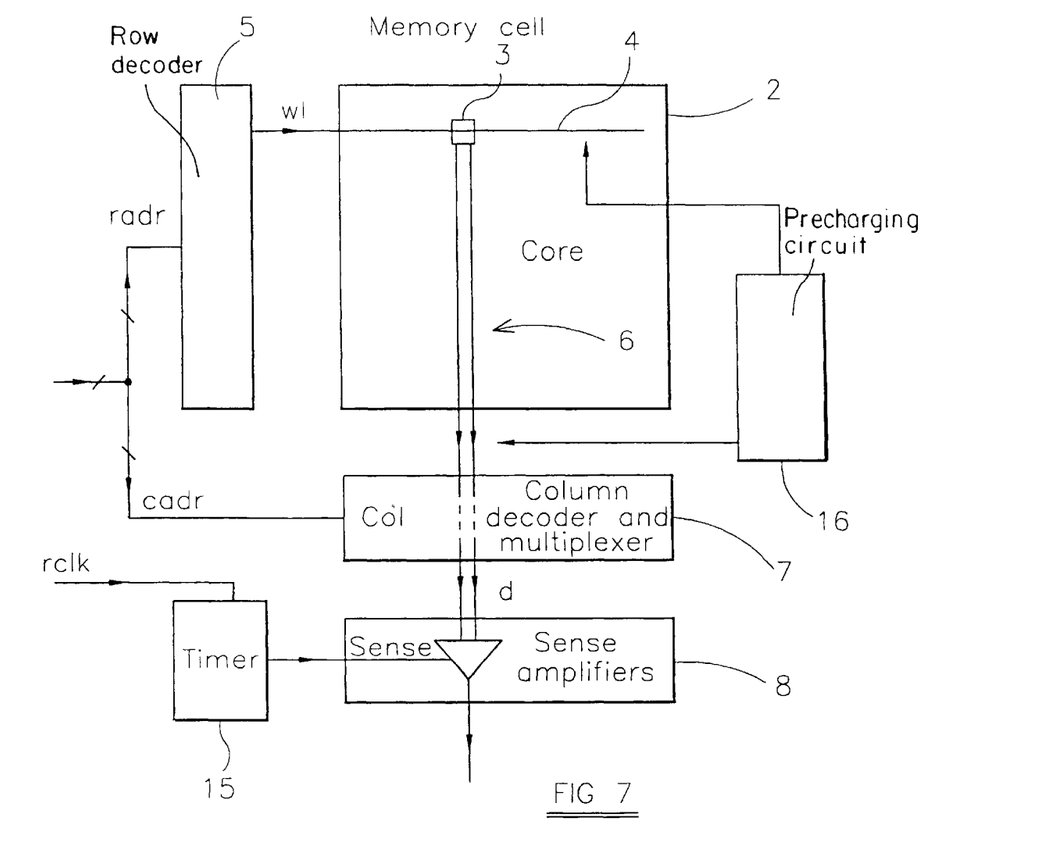
FIG. 7 is a block schematic diagram illustrating part of the memory of FIG. 5.
Figure 8:
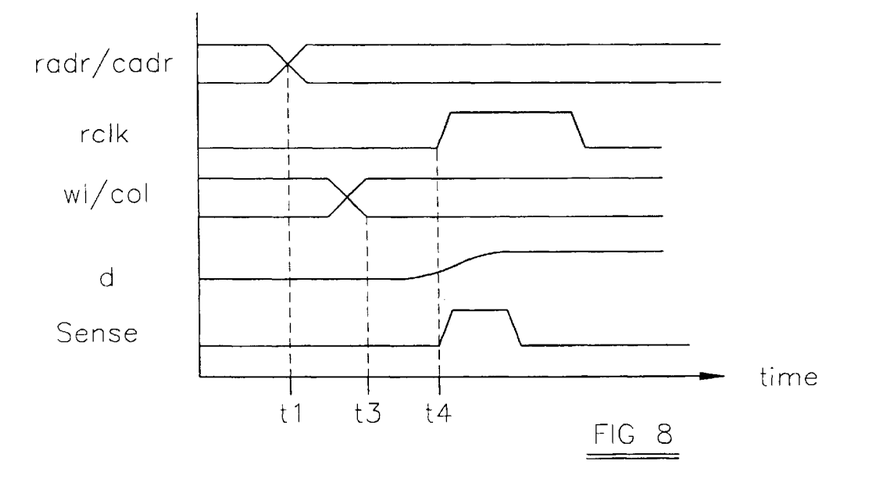
FIG. 8 is a waveform diagram illustrating some of the waveforms which occur in the part of the memory shown in FIG. 7.

FIG. 7 illustrates the basic structure of the memory shown in FIG. 5 relevant to a read cycle. Thus, the row decoder 5 and the column decoder and multiplexer 7 do not have inputs which receive the read clock signals "rclk". Instead, as soon as a change in row or column address signals "radr" or "cadr" occurs, the appropriate row select signal "wl" is supplied directly to the core 2 to enable reading of the selected row of memory cells 3. Similarly, the column decoder and multiplexer 7 connects the or each column of memory cell outputs via the multiplexer to the input of the corresponding sense amplifier 8. Thus, after a change of address as illustrated at time t1 in FIG. 8, the row and column select signals are set up with the minimum of delay and this is achieved by time t3. The differential input signal d to the sense amplifier 8 changes towards the value corresponding to the contents of the selected memory cell 3 and a sufficient signal margin for causing the sense amplifier 8 to produce at its output the correct output voltage is achieved at a time t4. The read clock signal "rclk" rises at that time to its active state and a timer 15 passes this without delay as the sense amplifier enabling signal "sense". The time 15 shown in FIG. 7 merely limits the duration of the signal "sense" but does not delay the availability at the output Q of the memory of the correctly read data.

As compared with the memory shown in FIG. 1, the memory shown in FIG. 5 does not introduce any fixed or self-timed delays in reading of data from the memory cells 3. In other words, there are no fixed or self-timed delays during the period from when the address changes at the time t1 to when the sense amplifiers 8 are enabled at the time t4. Instead, this time period, which is equal to the address setup time of the read cycle shown in FIG. 2, can be chosen at will and externally of the memory by selecting the delay between the active phase of the read clock "rclk" and the change in the address signal "radr/cadr".

Because this delay can be set at will to any desired time period, it is possible to minimize the read cycle time of the memory even after designing of a RAM compiler has been completed. For example, the specific worst case conditions of operation and of technology for the particular memory being implemented can be determined. Also, differences between integrated circuits produced by different foundries are generally known. It is therefore possible to calculate the maximum address setup time for a specific embodiment of the memory and this may then be used as the time by which the active read clock pulse "rclk" must be delayed to an address change. Thus, for any specific application, the read cycle time of the memory may be minimized and hence the performance of the memory may be optimized.

FIG. 7 also illustrates a precharging circuit 16 which is arranged to precharge the row and column address lines 4 and 6 with the timing illustrated by the signals "rowprech" and "colprech" shown in FIG. 6. If an address change requires that a different row be addressed as compared with a previous memory cycle, it is necessary for both the row and column address lines 4 and 6 to be precharged by the precharging circuit 16 to predefined charge states before a subsequent memory cycle. Row precharging is necessary to avoid memory cell corruption and consumes significant power in setting up circuit nodes before a new row is addressed or selected. However, if an address change requires only that a different set of columns be selected, then it is only necessary to perform a column precharge. Thus, the precharging circuit 16 is arranged to distinguish when only a change in column addressing is required and precharges only the column address lines 6. This involves only sense amplifier and multiplexer equalization and consumes relatively little power. Because the memory cells 3 of the newly addressed columns are already "open", they are effectively already to be read. Thus, by controlling precharging in this way, substantial savings in power consumption can be achieved, for example amounting to as much as 15 or 20% of the total power consumption of the memory depending on the size and aspect ratio of the core 2.

What is claimed is:

1. A synchronous memory, comprising:
   a) a core comprising a plurality of memory cells;
   b) N sense amplifiers having inputs, where N is a positive integer;
   c) an address input;
   d) a non-clocked addressing circuit arranged, in response to a change of an address at said address input, to supply memory cell address signals without delay to said core so as to select N of said memory cells and so as to connect said selected N memory cells to said inputs of said N sense amplifiers, respectively; and
   e) a first clock input arranged to enable said N sense amplifiers immediately upon receipt of an active external read clock signal.

2. A memory as claimed in claim 1, comprising a single port random access memory.

3. A memory as claimed in claim 1, comprising a static random access memory.

4. A memory as claimed in claim 1, comprising a second clock input for receiving write clock signals for controlling writing into said memory.

5. A memory as claimed in claim 1, comprising a first decoder for decoding said address to enable reading of a selected group of said memory cells, and a second decoder and multiplexer for decoding said address to connect N of said memory cells of said selected group to said inputs of said N sense amplifiers, respectively.

6. A memory as claimed in claim 1, comprising a timer for disabling said sense amplifiers a predetermined time after receipt of said active read clock signal.

7. A memory as claimed in claim 1, comprising row address lines, column address lines and a precharging arrangement, said memory cells being arranged at least notionally as rows connected to said row address lines and columns connected to said column address lines, said row and column address lines being connected to said precharging arrangement for precharging said row and column address lines after a change of said address at said address input.

8. A memory as claimed in claim 7, in which said precharging arrangement is arranged to precharge only said column address lines after a change in only a column address.

9. A synchronous memory, comprising:
   a) a plurality of memory cells;
   b) N sense amplifiers having inputs, where N is a positive integer;
   c) an address input;
   d) an addressing circuit arranged to select N of said memory cells in response to an address at said address input and to connect said selected N memory cells to said inputs of said N sense amplifiers, respectively;
   e) a first clock input arranged to enable said N sense amplifiers immediately upon receipt of an active read clock signal;
   f) a first decoder for decoding said address to enable reading of a selected group of said memory cells; and
   g) a second decoder and multiplexer for decoding said address to connect N of said memory cells of said selected group to said inputs of said N sense amplifiers, respectively.

10. A synchronous memory, comprising:
    a) a plurality of memory cells;
    b) N sense amplifiers having inputs, where N is a positive integer;
    c) an address input;
    d) an addressing circuit arranged to select N of said memory cells in response to an address at said address input and to connect said selected N memory cells to said inputs of said N sense amplifiers, respectively;
    e) a first clock arranged to enable said N sense amplifiers immediately upon receipt of an active read clock signal;
    f) row address lines;
    g) column address lines;
    h) a precharging arrangement; and
    i) said memory cells being arranged at least notionally as rows connected to said row address lines and columns connected to said column address lines, said row and column address lines being connected to said precharging arrangement for precharging said row and column address lines after a change of said address at said address input, said precharging arrangement being arranged to precharge only said column address lines after a change in only a column address.

* * * * *